United States Patent [19]

Warner

[11] Patent Number: 5,586,125
[45] Date of Patent: Dec. 17, 1996

[54] METHOD FOR GENERATING TEST VECTORS FOR CHARACTERIZING AND VERIFYING THE OPERATION OF INTEGRATED CIRCUITS

[76] Inventor: William T. Warner, 402 Creekview Dr., Morgan Hill, Calif. 95037

[21] Appl. No.: 344,391

[22] Filed: Nov. 22, 1994

Related U.S. Application Data

[63] Continuation of Ser. No. 165,555, Dec. 10, 1993, abandoned, which is a continuation of Ser. No. 23,320, Feb. 26, 1993, abandoned.

[51] Int. Cl.⁶ .................................................. G01R 31/28
[52] U.S. Cl. .......................................................... 371/27
[58] Field of Search .................................. 371/27, 23, 13, 371/15.1, 22.1; 395/183.08, 183.09, 183.11, 183.10, 183.13, 183.14, 183.1, 183.01

[56] References Cited

U.S. PATENT DOCUMENTS

| | | | |
|---|---|---|---|
| 4,479,196 | 10/1984 | Ferrer et al. | 364/900 |
| 4,672,307 | 6/1987 | Breuer et al. | 324/73 R |
| 4,692,921 | 9/1987 | Dahbura et al. | 371/27 |
| 4,710,872 | 12/1987 | Scarborough | 364/300 |
| 4,991,176 | 2/1991 | Dahbura et al. | 371/27 |
| 5,003,470 | 3/1991 | Carpenter et al. | 364/200 |

OTHER PUBLICATIONS

Deng et al "Exploring An Unknown Graph" IEEE 1990 pp. 355–361.

*Primary Examiner*—Robert W. Beausoliel, Jr.
*Assistant Examiner*—Joseph E. Palys

[57] ABSTRACT

The present invention is a method for operating a data processing system to generate a sequence of test states containing a predetermined set of states and/or transitions for use in testing an integrated circuit or the like. The method minimizes the number of additional states and/or transitions contained in the test sequence while preserving any constraints on the sequence of transitions that may be applied to the circuit to be tested. The present invention operates by defining a graph containing the predetermined set of states and/or transitions. The states are the vertices of the graph and the transitions are edges of the graph. The graph is then augmented if needed with additional states and/or transitions. The additional states and/or transitions assure the existence of an Eulerian Path through the graph. The additional states assure that the graph is connected, and that each vertex in the graph, with the possible exception of two vertices, has the same number of inbound and outgoing transitions. The Eulerian Path is then traced to provide a sequence of states that includes the input list of states and/or transitions.

8 Claims, 5 Drawing Sheets

METHOD FOR GENERATING TEST VECTORS FOR CHARACTERIZING AND VERIFYING THE OPERATION OF INTEGRATED CIRCUITS

CROSS REFERENCE TO RELATED APPLICATION

This is a continuation of application Ser. No. 08/165,555 filed on Dec. 10, 1993, now abandoned which is a continuation of application Ser. No. 08/023,320 filed on Feb. 26, 1993, now abandoned.

FIELD OF THE INVENTION

The present invention relates to integrated circuit testing, and more particularly, to an improved method generating the test conditions used to characterize and verify the operation of integrated circuits.

BACKGROUND OF THE INVENTION

A significant fraction of the improvements in the costs and functions of custom integrated circuits is related to the use of well characterized libraries of standard cells. Such cell libraries provide a variety of building blocks from which more complicated circuits may be constructed. Hence, reducing the time to design and characterize standard cells is highly desirable.

The process of testing and characterizing a new cell is very expensive. Each standard cell may be viewed as having a number of input lines and output lines. To completely test a cell, the response of the cell must be determined for each possible transition of the input lines. Each transition is implemented by changing the state of the input lines. If there are N input lines, there are, in principle. $2^N$ possible input states. A transition connects two of these input states; hence, the number of possible transitions is the number of different combinations of 2 input states. It is clear that the work to test a cell can rapidly exceed the practical capacity of even the fastest circuit tester or simulator if N is large.

Current methods of generating sequences of input states use a "brute force" strategy. In general, the cell designer can specify a minimal set of allowed transitions of the input lines that the cell is designed to handle. Each transition corresponds to two input states for the cell. In general, each cell also has a constraint on the sequence of input states. For example, in combinational blocks (Those which are not clocked) any transition in which more than one input line changes may cause a race condition. In this case, the constraint requires that no more than one input line change between any two states.

Were it not for this constraint, a test sequence that tests all of the transitions could be generated by sequentially presenting the two states representing the allowed transitions to be tested. For example, consider a first transition represented by the change from state $S_1$ to $S_2$, and a second transition which is represented by change From state $S_3$ to $S_4$. In the absence of the constraint in question, the test sequence $S_1$, $S_2$, $S_3$, $S_4$ would be sufficient to test these two transitions. However, in the presence of the constraint, the sequence $S_2$, $S_3$ may not be an allowed sequence of input states. In this case, a sequence of states satisfying the constraint, beginning with $S_2$ and ending with $S_3$ must be introduced into the test sequence to bring the cell from the test of $S_1$–$S_2$ transition to state $S_3$ so that the $S_3$–$S_4$ transition can be tested.

The present methods for generating the sequence of states corresponding to the allowed transitions does not take into account the efficiency of the sequence of input states. The only criterion for the test sequence is that all necessary transitions are included. Test sequences created with this method include a high percentage of repeated transitions, and transitions that are meaningless to the characterization of the cell. As a result, it requires approximately one processor-year to complete the characterization of a library of ASIC standard cells, each cell having at most 10 to 15 input lines.

Broadly, it is the object of the present invention to provide an improved method for generating a test sequence for characterizing a circuit.

It is a further object of the present invention to provide a test sequence having fewer repeated states than test sequences generated by prior art methods.

These and other objects of the present invention will become apparent to those skilled in the art from the following a detailed description of the invention and the accompanying drawings.

SUMMARY OF THE INVENTION

The present invention is method for operating a data processing system to generate a sequence of test states containing a predetermined set of states and/or transitions. The predetermined set of states and/or transitions is specified by an input list of states and an input list of transitions, either of which may be empty. The test sequence is to be used in testing an integrated circuit or the like. The present invention operates by defining a graph containing the predetermined set of states and/or transitions. The states are the vertices of the graph and the transitions are the edges of the graph. The graph is then augmented if needed with additional states and/or transitions. The additional states and/or transitions assure the existence of an Eulerian Path through the graph. The additional states assure that the graph is connected and that each vertex in the graph, with the possible exception of two vertices, has the same number of inbound and outgoing transitions. The Eulerian Path is then traced to provide a sequence of states that includes the input list of states and transitions.

DETAILED DESCRIPTION OF THE INVENTION

A sequence of test states may be defined either in terms of the transitions of the input lines that are to be tested or in terms of the individual states of the input lines that are to be tested. For simplicity, the manner in which the present invention operates when the sequence of test states is defined in terms of a set of transitions of the input lines will be discussed first. The case in which the test is specified in terms of a set of states to be obtained will be discussed in more detail below.

Consider a standard logic circuit that is to be tested. Denote the number of input lines by N. An input state, S, consists of the logic values to be placed on each of these lines. In a binary system, each input line may be either 0 or 1. It is assumed that the circuit designer has specified a set of input states $\{T_i\}$ for which the logic circuit is designed to operate. Each transition may be defined as a sequence of two states. In addition, it is assumed that there is some constraint or rule which limits the manner in which the input state can be changed from one state to another state.

The set of input transitions can be represented by a graph. Each state specified by the transitions is represented as a vertex in the graph. A transition is represented by a directed line connecting the two vertices that represent the source and destination states of the transition. For simplicity, the graph will be drawn in two-dimensions. As noted above, there are N input values that specify each input state. Without loss of generality, these may be divided into two groups. For example, if N=16, the first 8 lines may be viewed as an 8-bit number specifying the x-coordinate of a vertex and the second 8 lines may be viewed as an 8-bit number specifying the y-coordinate of the vertex. The vertex is then a point at the coordinates (x,y) in a two-dimensional plot. A transition is an arrow from the vertex representing the source state to the vertex representing the destination state of the transition.

It should be noted that the graph could also be represented in more than two-dimensions. For example, the input lines could be grouped in four groups of 4 lines. In this case, the graph would consist of vertices in a four-dimensional space and arrows connecting these vertices. For most purposes, the dimensionality of the graph representation is not important, and since it is difficult to visualize graphs in more than two-dimensions, the two-dimensional representation has been chosen for the purposes of this discussion.

Figure 1:
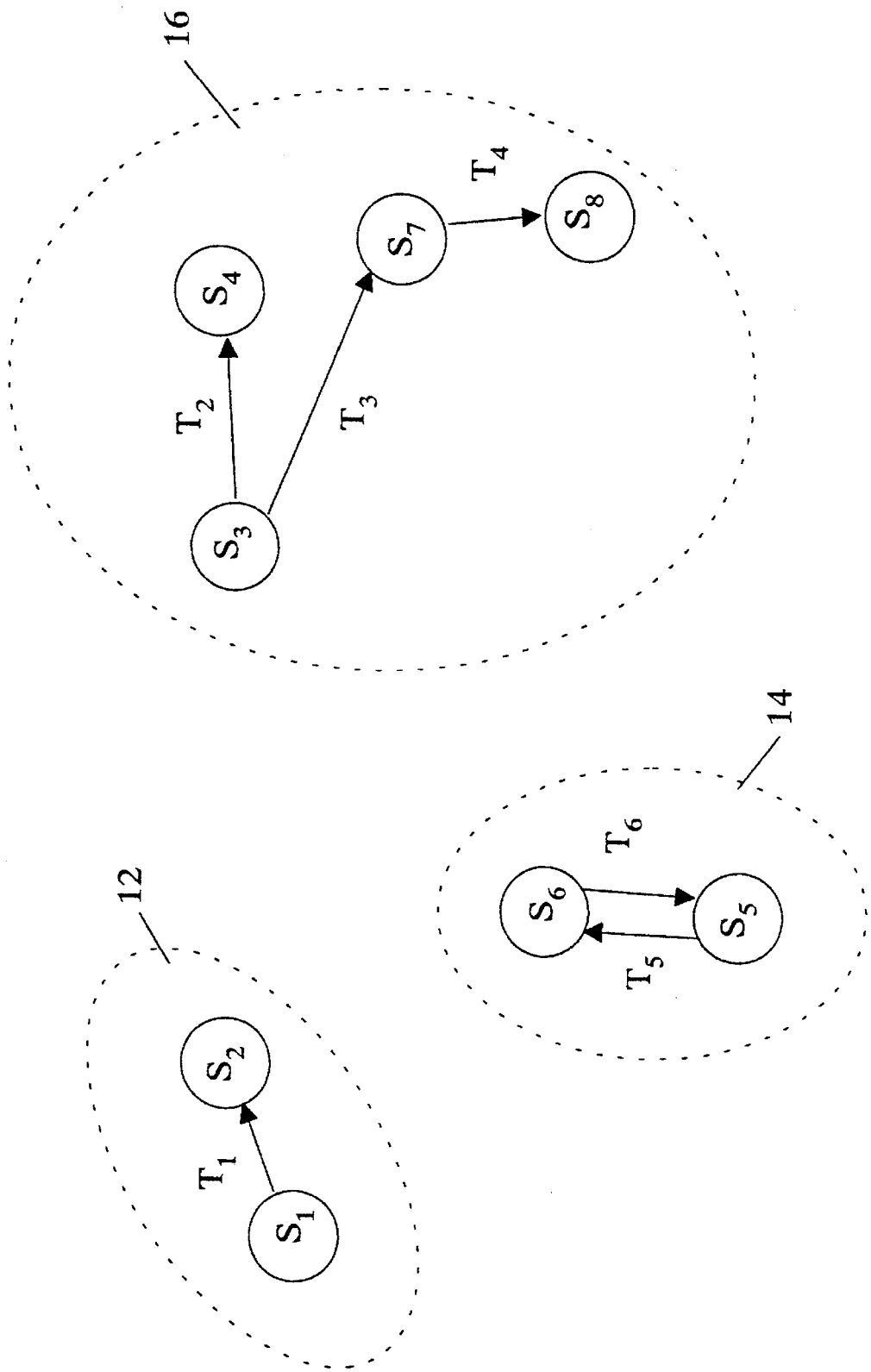
FIG. 1 depicts a simple graph depicting a set of 6 desired test transitions.

Refer now to FIG. 1 which is a simple graph depicting a set of 6 desired test transitions $T_1$–$T_6$ which are defined in terms of 8 states shown at $S_1$–$S_8$. The goal of the present invention is to provide a connected sequence of states $\{Si\}$ such that the transitions $T_1$–$T_6$ are all traversed during the sequential execution of this sequence. In addition, this connected sequence should have a minimum of additional transitions that must be traversed. This is accomplished in three steps. First, states and/or transitions are added to the graph to provide an expanded graph that is connected if the original graph was not connected. Second, additional transitions are added to the graph to equalize the number of transitions leading into and out of various states. Finally, a path is then defined through the expanded graph which traverses each of the desired transitions once with a minimum of additional transitions being traversed. The manner in which these steps are carried out will now be discussed in more detail.

A graph is connected if each state on the graph can be reached from any other state on the graph. In determining whether or not a graph is connected, the directions of the transition arrows are not considered. For example, state S4 is defined as connected to state $S_3$ even though one could not traverse the graph from state $S_4$ to state $S_3$.

Figure 2:
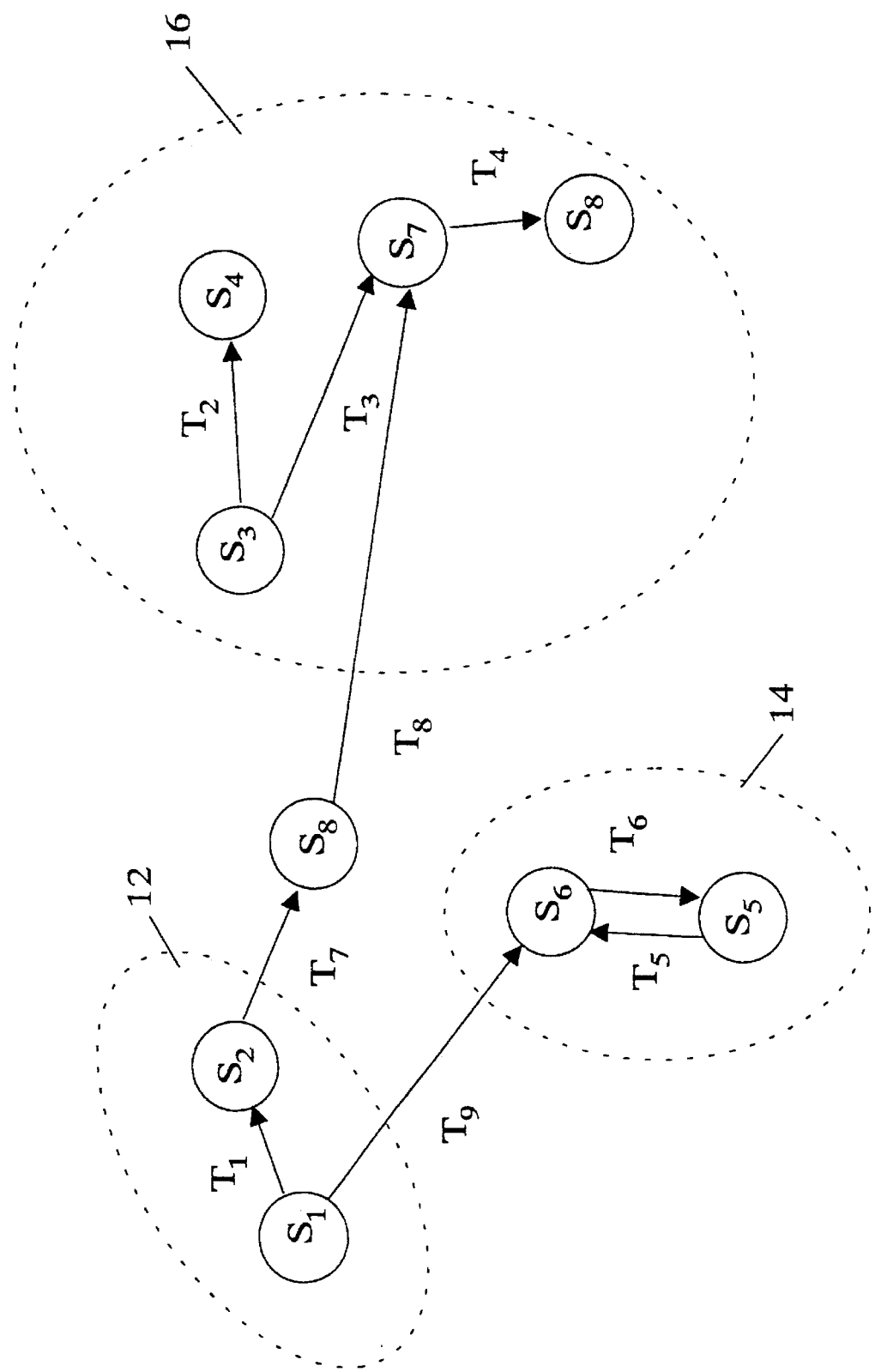
FIG. 2 depicts the transitions and states needed to connect the graph shown in FIG. 1

The graph shown in FIG. 1 is clearly not connected. It includes three connected sub-graphs 12, 14, and 16. Refer now to FIG. 2 which shows the transitions and states needed to connect the graph shown in FIG. 1. To connect the graph, transitions could, in principle, be added from sub-graph 12 to sub-graph 14 and to sub-graph 16. Such a transition, $T_9$, is shown between state $S_1$ of sub-graph 12 and state $S_6$ of sub-graph 14. It must be remembered that it is assumed that a constraint condition exists that forbids certain transitions. Hence, it may not be possible to find a transition from a state in sub-graph 12 to one of the states in sub-graph 16 or sub-graph 14. In this case, one or more intermediate states, such as $S_8$, must be added.

Figure 3:
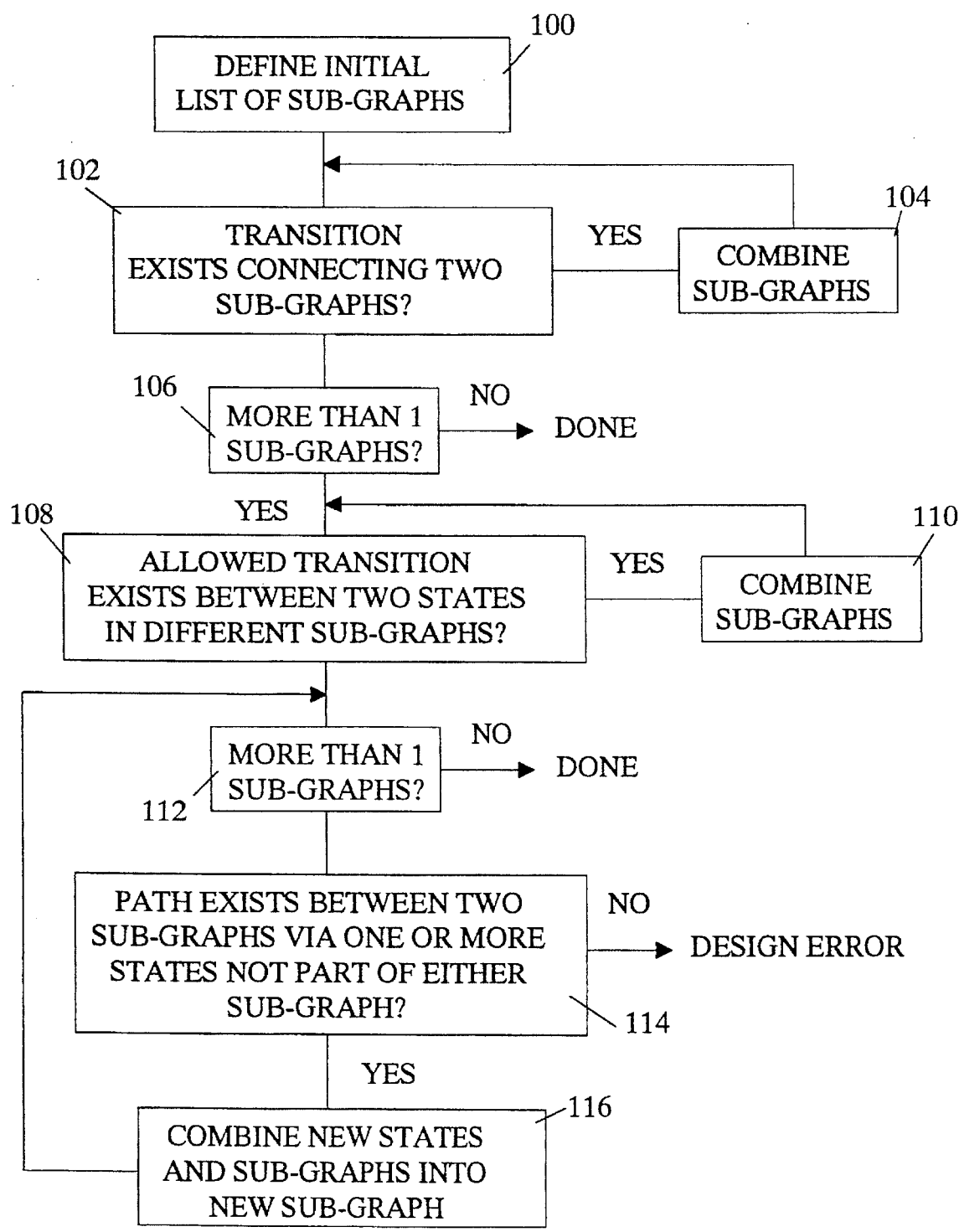
FIGS. 3 is a flow chart for the method of connecting a graph according to the present invention.

The method used to determine if a graph is connected begins with the states and transitions defined in the test set. It is assumed that these states and transitions are stored as lists on the data processing system used to generate the test sequence. Refer now to FIG. 3 which is a flow chart for the method of connecting a graph according to the present invention. The process begins by defining a set of sub-graphs each including one of the states and storing the identity of the sub-graph with the corresponding state in the state list as shown at 100.

Each sub-graph is then examined to determine if a transition exists between it and a state in another sub-graph shown at 102. If such a transition exists, the two sub-graphs are combined to form a new sub-graph that replaces the pair of sub-groups shown at 104. This process is repeated until there is only one sub-graph left or until no reduction in the number of sub-graphs occurs. If only one sub-graph remains, then the graph is connected. In this case, the present invention proceeds to the step of equalizing the states described below.

If there is more than one sub-graph remaining, transitions and/or additional states must be added to connect the graph. The present invention begins by attempting to find additional transitions that connect sub-graphs. For each pair of sub-graphs, each state in the first sub-graph is tested for an allowed transition (i.e., one that meets the constraint condition) to a state in the second sub-graph shown at 108. If such a transition is found, the transition is added to the list of transitions and the two sub-graphs are combined into a single sub-graph that replaces the pair of sub-groups as shown at 110. This step is repeated until there is only one sub-graph left or until no reduction in the number of sub-graphs occurs shown at 112. If only one sub-graph remains, then the graph is connected. In this case, the present invention proceeds to the step of equalizing the states described below.

If there is still more than one sub-graph, new states must be added shown at 114. For each pair of sub-graphs, a new sub-graph is defined which contains all the states not in the first member of the pair that can be connected by an allowed transition from the first member of the pair of sub-graphs. Each member of this new sub-graph is examined for an allowed transition connecting it to a state in the second member of the pair of sub-graphs. If such a transition exists, then the state in question and the connecting transitions needed to connect the pair of sub-graphs by this state of the new sub-graph are added to the lists of states and transitions and the two sub-graphs. Then the new state and sub-graphs are combined to form a new sub-graph that replaces the original pair of sub-graphs. If only one sub-graph remains, then the graph is connected. In this case, the present invention proceeds to the step of equalizing the states described below.

If more than one sub-graph remains, or if no such transition exists, then at least two new states must be added. The process described above is repeated by defining successive new sub-graphs until one that connects the first pair via the intervening new sub-graphs is found. At the $i^{th}$ iteration, an $i^{th}$ new sub-graph is defined. This sub-graph contains all the states that may be connected by an allowed transition to any of the states in the $(i-1)^{st}$ new sub-graph and which are not contained in the original member of the pair or any preceding new sub-graph. Each state in this new sub-graph is examined for an allowed transition connecting it to a state in the second member of the pair of sub-graphs. If such a transition exists, then the state in question and the connecting transitions and states in the other new sub-graphs are added to the lists of states and transitions. The two sub-graphs and the new states are combined to form a new sub-graph that replaces the original pair of sub-graphs. The process is repeated until all of the sub-graphs have been combined into a single sub-graph, or no further states have been found which are not contained either in the original pair or one of the newly created sub-graphs.

It should be noted that if the above-described search, often referred to a breadth-first search, does not end in all of the sub-graphs being connected, then a design error has occurred in the cell to be tested, since there is an allowed state that cannot be reached by an allowed transition from another allowed state. In the preferred embodiment of the present invention, the complete set of allowed states is tested for such an error by attempting to combine all allowed states into one sub-graph via the allowed transitions. If this test fails, then a design error is present, and the generation of test sequences is aborted. If this first test is passed, then a single test sequence designed to visit any sub-set of the allowed states and/or transitions can always be found.

The present invention makes use of Euler's theorem of 1736 which states that if a graph satisfies the following conditions, a path which traverses each edge of the graph exactly once may be constructed. Such a path is called an Eulerian Path. If the path returns to its origin, it is called an Eulerian circuit. For a graph to have an Eulerian Path, it must be connected. Connectivity is guaranteed in the present invention by the above-described procedures. The second condition that must be satisfied is that the number of incoming edges at each vertex must be the same as the number of outgoing edges from the vertex with the possible exception of two vertices in the graph: one with exactly one more outgoing edge than incoming edge and the other with exactly one more incoming edge than outgoing edge. If the number of incoming edges matches the number of outgoing edges for all vertices, then an Eulerian Circuit exists for the graph. If the above description occurs, only an Eulerian Path exists. The above-described procedures do not guarantee that this second condition is met. Hence, the present invention must equalize the number of incoming and outgoing transitions for each state in the connected graph generated by the above-described procedure before going on to find the path through the graph.

The second step in the method of the present invention involves adding transitions to the various states in the graph to equalize the number of incoming and outgoing transitions defined for each state. It should be noted that it does not matter whether the added transitions duplicate some already in the graph or are transitions that are not yet in the graph. The process need only add a transition to a state with too few incoming transitions from a state with too few outgoing transitions. Ideally, the addition is accomplished by adding a single transition between the states. However, if no such single transition can be found, then a transition can be added via one or more intermediate states. It should be noted that the additional transitions will not change the status of the intermediate states, since each such state will gain one inbound transition and one outbound transition.

Figure 4:
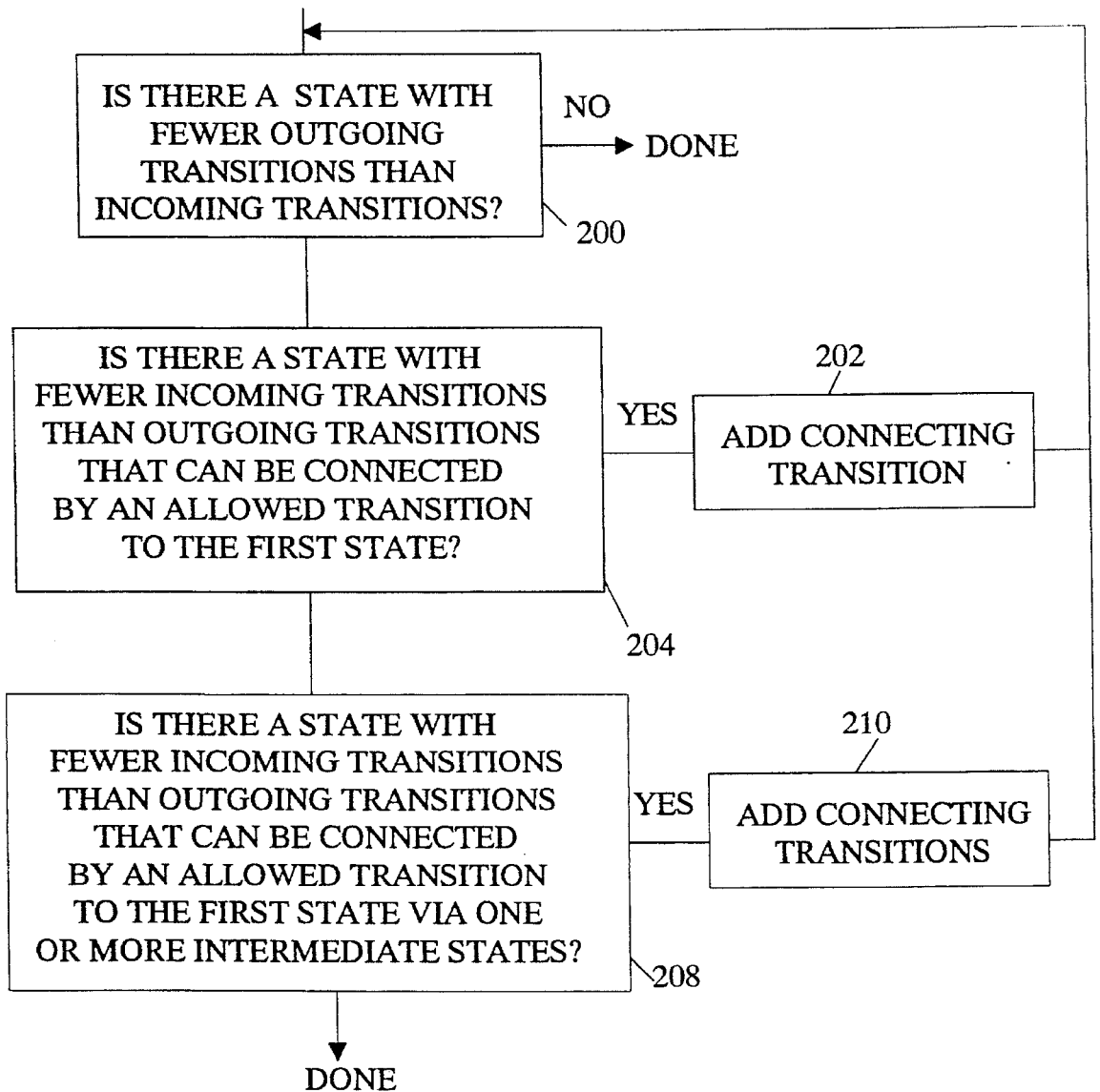
FIG. 4 is a flow chart for a method for equalizing the number of incoming and outgoing transitions at the various nodes of a graph.

Refer now to FIG. 4 which is a flow chart of the method used to equalize the number of inbound and outbound transitions in the graph. The manner in which transitions are added is analogous to the methods described above for finding connections between sub-graphs. The list of states is examined to find a first state having fewer outgoing transitions than incoming transitions as shown at 200. The remaining states are then examined to find a second state having fewer incoming transitions than outgoing transitions that may be reached from the first state by an allowed transition as shown at 204. If a state is found the transition is added to the list of transitions as shown at 202. If no second state can be found, then a breadth-first search is made for a transition between the first state and a second state via one or more intermediate states as shown at 204.

To add transitions via an intermediate state to a first state having more outgoing transitions than incoming transitions via an intermediate state, a list is made of all states that can be reached from the first state by allowed transitions. This list is searched for any state that has more outgoing transitions than incoming transitions. If such a state exists, the transitions connecting the state to the first state are added to the transition list as shown at 208. If no such state exists, than for each entry in the list, a new list is generated containing all of the states that may be reached by allowed transitions from the entry in question. This new list is tested for states having more outgoing transitions than incoming transitions. If such a state is found, the transitions connecting this state to the first state are added to the list. If no such state exists, the process is iterated by adding new lists until such a state is found.

Once the transitions into and out of the various states have been equalized, a path through the graph is generated. As noted above, there may be two states in which the number of outgoing transitions is different from the number of incoming transitions. If this is the case, the state in which the number of outgoing transitions is larger than the number of incoming transitions is used as the start of the path, the state with more incoming than outgoing transitions is used as the destination of the path. If all states in the graph have the same number of incoming and outgoing transitions, then any state may be picked for the start and end of the path.

The process begins by picking a transition outgoing from the starting state from the list of transitions. The transition in question is then marked as being "used". The transition is by definition an incoming transition of some other state in the graph. This state becomes the new current state. The process is continued by picking an unused outgoing transition from the current state, marking the transition as used, and then defining the state on which the transition terminates as the new current state. The process terminates when the current state has no unused outgoing transitions. As this process is carried out, the sequence of current states is recorded in a list, referred to as the path list.

Figure 5:
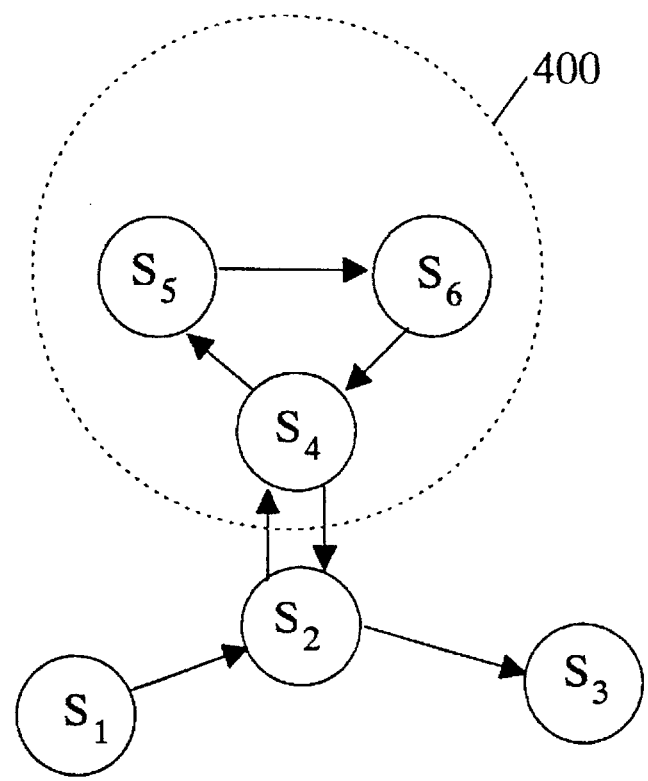
FIG. 5 depicts a graph with a simple loop.

If all of the transitions have been marked as used when the process terminates, then the list of current states is the test sequence. However, it is possible for the process to terminate before all of the transitions are used. Such a situation can occur when the graph contains a loop and the path traversed by the above-described procedure bypasses the loop. Such a situation is shown in FIG. 5 which shows a simple graph having a loop. The path from $S_1$ to $S_3$ may miss the loop 400 involving $S_4$, $S_5$, and $S_6$ depending on which outgoing transition from $S_2$ is selected first.

The only type of loop that is possible given that the number of incoming and outgoing transitions are the same for all states internal to the path, is one of the type shown in FIG. 5. That is, a loop that begins and ends on the same state.

Hence, there will always be an unused transition leaving one of the states in the path list. This state is used as the start of another path which is traversed in the manner described above. When this path is completed, it is inserted into the path list such that the new path list traverses this loop before proceeding along the path originally found by the above-described procedure. This loop detection algorithm is repeated until all of the transitions have been marked as used.

The method of the present invention is preferably practiced on a general purpose data processing system whose output is the sequence of test states. This sequence is transferred to either a circuit simulator or an actual chip tester depending on the stage of development of the cells in question.

The above-described embodiments of the present invention have been described in terms of a method for generating a test sequence starting from the list of desired transitions in the test sequence. Alternatively, one could start with a set of desired states to be included in the test sequence. In this case the initial graph would not have any edges. The initial graph would, in essence, consist of N unconnected sub-graphs, each sub-graph including one of the desired states. The step of connecting the graph would then provide the edges. The remainder of the method of the present invention operates exactly as described above.

It should be noted that in normal mathematical descriptions of graphs, each of the states discussed above would be referred to as a vertex of the graph.

Various modifications to the present invention will become apparent to those skilled in the art from the foregoing description and accompanying drawings. Accordingly, the present invention is to be limited solely by the scope of the following claims.

What is claimed is:

1. A method for generating an Eulerian sequence of test vectors for an integrated circuit, the method comprising the steps of:
   (a) generating and storing a list of input states for which the circuit is designed to operate;
   (b) generating and storing a list of transitions between said input states, wherein said states correspond to inputs to said integrated circuit, each of said transitions is a transition between two such states and said transitions conform to some constraint restricting the existence of transitions;
   (c) defining a graph having vertices that correspond to states in said list of input states and edges that correspond to the transitions in said list of transitions, wherein each such transition is a transition for which a test is desired and wherein each vertex corresponds to an input state to which at least one such transition provides a connection;
   (d) determining all sub-graphs of said graph;
   (e) determining if said graph is connected, and if said graph is not connected adding at least one transition that meets said constraint and that connects a vertex in one of said sub-graphs with a vertex in another of said sub-graphs;
   (f) determine if said graph is connected, and if said graph is still not connected, adding to said graph one or more nodes that correspond to input states having transitions that conform to said constraint condition such that said transitions connect one sub-graph to another sub-graph;
   (g) determining if said graph is Eulerian, and if said graph is not Eulerian, adding additional edges corresponding to transitions from said input list of transitions and, if necessary, vertexes corresponding to states from said input list of states to cause said graph to be Eulerian, wherein said transitions conform to said constraint; and
   (h) determining a single path through said graph such that each transition in said list of transitions is used precisely once in traversing said path, said Eulerian sequence of test vectors for said integrated circuit being determined by the sequence of vertices on said path and transferring said Eulerian Sequence of test vectors to a testing unit for testing said integrated circuit, wherein said testing unit is selected from a group consisting of a circuit simulator and a chip tester.

2. The method as defined in claim 1, wherein the vertices further comprise a first vertex with exactly one more inbound transition than outbound transition and a second vertex with exactly one more outbound transition than inbound transition.

3. The method as defined in claim 1, wherein said step (d) of determining all sub-graphs comprises the steps of:
   (d.1) defining a set of sub-graphs such that each node in said graph is in a distinct subgraph; and
   (d.2) for each sub-graph, identify all transitions which connect that subgraph with another subgraph, and for each such connecting transition, combine the sub-graphs into one subgraph.

4. The method as defined in claim 1, wherein said step (e) of adding transitions between vertexes of said sub-graphs, comprises the steps of:
   (e.1) determining if said graph is connected by counting the number of subgraphs, and if said graph is not connected, select a first sub-graph, until there is only one sub-graph or until all sub-graphs have been traversed:
      test each vertex in said first sub-graph for a transition that meets said constraint and that connects said vertex with a vertex in another sub-graph, if such a transition exists, said transition is added to said list of transitions, and said first sub-graph and said other sub-graph are combined into one sub-graph, if no such transition exists from said first sub-graph, select a new first sub-graph; and
   (e.2) if said graph is still not connected, repeating step (e.1) until either said graph is connected or the number of sub-graphs cannot be further reduced by repeating step. (e.1).

5. The method as defined in claim 1, wherein said step (f) of adding nodes and transitions between subgraphs comprises:
   (f.1) for each pair of sub-graphs define a new sub-graph that contains all the vertexes that may be reached by a transition that conforms to said constraint from a vertex in a first member of said pair of sub-graphs; and
   (f.2) testing each vertex in said new sub-graph to determine if there exists a transition that conforms to said constraint and that connects such vertex in said new sub-graph with a vertex in a second member of said pair of sub-graphs, and if such a transition exists adding said vertex in said new sub-graph to said graph and adding, to said list of transitions, said transition from said vertex in said first member to said vertex in said new sub-graph and said transition from said vertex in said new sub-graph to said vertex in said second member.

6. A method for generating an Eulerian sequence of test inputs for a system, the method comprising the steps of:
   (a) generating and storing a list of input states for which the system's behavior is known, wherein each distinct input to said system is an input state;

(b) generating and storing a list of transitions between said input states, wherein each of said transitions is a transition between two such states and said transitions conform to some constraint restricting the existence of transitions, wherein said sequence of test inputs includes each transition in a desired set of transitions and only a minimum number of other transitions;

(c) defining a graph having vertices that correspond to states in said list of input states and edges that correspond to the transitions in said list of transitions, wherein each such transition is a transition in said desired set of transitions and wherein the vertices correspond to inputs to said system at opposite ends of such transitions;

(d) determining all subgraphs of said graph;

(e) determining if said graph is connected by counting the number of subgraphs, and if said graph is not connected, select a first sub-graph, until there is only one sub-graph or until all sub-graphs have been traversed: test each vertex in said first sub-graph for a transition that meets said constraint and that connects said vertex with a vertex in another sub-graph, if such a transition exists, add said transition to said list of transitions, and combine said first sub-graph and said other sub-graph into one sub-graph;

(f) determine if said graph is connected by again counting the number of sub-graphs, and if said graph is still not connected, repeat step (e) until either said graph is connected or the number of sub-graphs cannot be further reduced by repeating step (e);

(h) determine if said graph is connected, and if said graph is still not connected, locate one or more vertexes that connect one sub-graph to another sub-graph by means of transitions that conform to said constraint condition;

(i) determining if said graph is Eulerian, and if said graph is not Eulerian, adding additional transitions from said input list of transitions and, if necessary, states from said input list of states to cause said graph to be Eulerian; and (j) determining a single path through said graph such that each transition in said list of transitions is used precisely once in traversing said path, said Eulerian sequence of test inputs being determined by the sequence of vertices on said path and transferring said Eulerian Sequence of test vectors to a testing unit for testing said integrated circuit, wherein said testing unit is selected from a group consisting of a circuit simulator and a chip tester.

7. The method as defined in claim 6, wherein said system is an integrated circuit.

8. The method as defined in claim 6, where in said step (d) of determining all sub-graphs comprises the steps of:

(d.1) defining a set of sub-graphs such that each node in said graph is in a distinct subgraph; and (d.2) for each subgraph, identify all transitions which connect that sub-graph with another subgraph, and for each such connecting transition, combine the subgraphs into one subgraph.

\* \* \* \* \*